United States Patent [19]

Bitzer et al.

[11] 4,196,233
[45] Apr. 1, 1980

[54] PROCESS FOR COATING INORGANIC SUBSTRATES WITH CARBIDES, NITRIDES AND/OR CARBONITRIDES

[75] Inventors: Diethelm Bitzer, Putzbrunn near Munich, Fed. Rep. of Germany; Dieter Lohmann, Pratteln, Switzerland

[73] Assignee: Ciba-Geigy Corporation, Ardsley, N.Y.

[21] Appl. No.: 813,364

[22] Filed: Jul. 6, 1977

Related U.S. Application Data

[63] Continuation of Ser. No. 547,286, Feb. 5, 1975, abandoned.

[30] Foreign Application Priority Data

Feb. 7, 1974 [CH] Switzerland ............... 001703/74
Feb. 7, 1974 [CH] Switzerland ............... 001704/74

[51] Int. Cl.² ..................... C23C 11/08; C23C 11/14
[52] U.S. Cl. .................................. 427/249; 427/252; 427/253; 427/255; 427/294; 427/295; 427/314; 427/318; 427/255.2; 427/255.3
[58] Field of Search ............ 427/228, 249, 252, 255, 427/226, 314, 318, 248 B, 248 C, 253, 295, 294

[56] References Cited

U.S. PATENT DOCUMENTS

| | | | |
|---|---|---|---|
| 3,399,980 | 9/1968 | Bourdeau | 23/345 |
| 3,637,320 | 1/1972 | Wakefield et al. | 415/200 |
| 3,656,995 | 4/1972 | Reedy | 427/249 |
| 3,771,976 | 11/1973 | Wakefield | 427/249 |
| 3,772,058 | 11/1973 | Bloom | 427/249 |
| 3,784,402 | 1/1974 | Reedy | 427/249 |
| 3,791,847 | 2/1974 | Araki et al. | 427/228 |
| 3,807,008 | 4/1974 | Reedy | 427/249 |

FOREIGN PATENT DOCUMENTS

2180463 1/1974 France.
1251054 10/1971 United Kingdom.

OTHER PUBLICATIONS

Caillet et al., *C.R. Acad. Sc. Paris*, p. 270, 1867 (1970).

*Primary Examiner*—Ronald N. Smith
*Assistant Examiner*—Janyce A. Bell
*Attorney, Agent, or Firm*—Luther A. R. Hall

[57] ABSTRACT

A process for coating inorganic substrates, especially metallic or metalloid substrates, sintered metal carbides and carbon materials with carbides, nitrides and/or carbonitrides, using certain nitriles as sources of carbon and nitrogen, is described. High deposition rates and smooth coatings of good to very good adhesion are achievable by this process.

15 Claims, No Drawings

PROCESS FOR COATING INORGANIC SUBSTRATES WITH CARBIDES, NITRIDES AND/OR CARBONITRIDES

This is a continuation of application Ser. No. 547,286, filed on Feb. 5, 1975, now abandoned.

The present invention relates to a process for coating inorganic substrates with carbides, nitrides and/or carbonitrides and to the substrates coated in accordance with this process.

It has been found that inorganic substrates can be coated in a simple manner with carbides, nitrides and/or carbonitrides of iron, boron or silicon or of the transition metals of sub-groups 4–6 of the periodic table by direct thermal reaction of iron, boron, silicon or transition metals of sub-groups 4–6 of the periodic table or derivatives thereof with substances which act as sources of carbon and nitrogen, optionally in the presence of further additives, by using, as sources of carbon and nitrogen, at least one compound of the formula I or II $$X-C\equiv N \quad \text{or} \quad N\equiv C-X_1-C\equiv N$$
$$(I) \qquad\qquad (II)$$

wherein X represents chlorine,

—CN, —CH$_2$—NH—CH$_2$CN, —CH$_2$N(CH$_2$CN)$_2$,

an alkyl group with 1–6 carbon atoms, which can be substituted by halogen atoms,

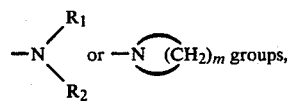

an alkenyl group with 2–4 carbon atoms which can be substituted by halogen atoms or

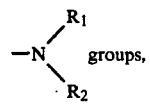

a cycloalkyl group with 3–6 carbon atoms or an aryl group with 6–10 carbon atoms, which can each be substituted by halogen atoms, methyl groups or

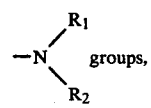

and X$_1$ represents an alkylene group with 1–10 carbon atoms, an alkenylene group with 2–4 carbon atoms, a phenylene or cyclohexylene group which can each be substituted by halogen atoms or

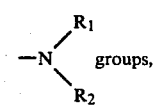

or a group of the formula

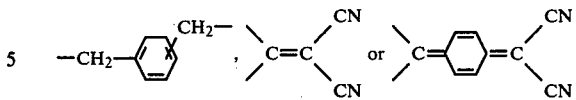

and R$_1$ and R$_2$ independently of one another denote hydrogen or an alkyl group with 1–4 carbon atoms and m denotes an integer from 4 to 7.

Compared to known methods, the process according to the invention is distinguished, above all, by its simplicity and economy, in that the elements carbon and nitrogen required to form the carbides, nitrides and/or carbonitrides, and optionally other elements which influence the course of the reaction, such as hydrogen and/or halogen, can be fed to the reaction zone in a simple manner and in the desired ratios. Furthermore high deposition rates and smooth coatings of good to very good adhesion can be achieved in accordance with the process of the invention, regardless of the type of substrate and even at reaction temperatures below approx. 900° C. A further advantage is that the process can in general be carried out at normal pressure or slightly reduced or slightly elevated pressure (approx. 700–800 mm Hg) which in many cases permits simplification of the apparatuses required to carry out the reaction.

The compounds of the formula I and II provide carbon and nitrogen, and where relevant hydrogen and/or halogen, in a reactive state, under the reaction conditions.

Alkyl, alkenyl, alkylene and alkenylene groups represented by X or X$_1$, or R$_1$ and R$_2$, can be straight-chain or branched. Halogen denotes fluorine, bromine or iodine, but especially chlorine.

Examples of unsubstituted alkyl groups X according to the definition are the methyl, ethyl, n-propyl, isopropyl, n-butyl, sec-butyl, tert-butyl, n-pentyl, isopentyl and n-hexyl group.

If groups according to the definition and represented by X or X$_1$ are substituted by

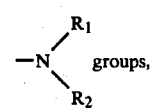

R$_1$ and R$_2$ preferably denote, independently of one another, hydrogen or the methyl or ethyl group.

Preferred substituents

are those wherein m represents an integer from 4 to 6.

Preferred compounds of the formula I are those wherein X denotes

—CH$_2$—NH—CH$_2$CN, —CH$_2$—N-(CH$_2$CN)$_2$,

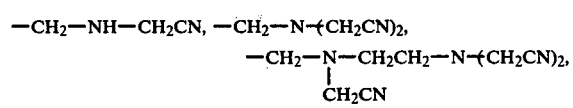

an alkyl group with 1–6 carbon atoms which can be substituted by halogen atoms,

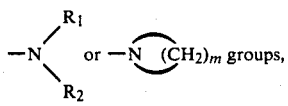 groups, an alkenyl group with 2–4 carbon atoms which can be substituted by halogen atoms or

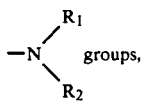 groups, a cycloalkyl group with 3–6 carbon atoms or an aryl group with 6–10 carbon atoms which can each be substituted by halogen atoms, methyl groups or

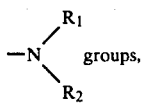 groups, and $R_1$ and $R_2$ independently of one another represent hydrogen or an alkyl group with 1–4 carbon atoms and m represents an integer from 4 to 7.

According to a further preference, X represents an alkyl group with 1–4 carbon atoms which can be substituted by chlorine atoms or

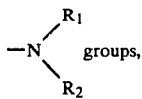 groups, an alkenyl or chloroalkenyl group with 2–4 carbon atoms or a phenyl group which can be substituted by halogen atoms, methyl groups or

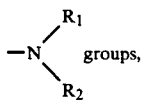 groups, and $R_1$ and $R_2$ independently of one another denote hydrogen or an alkyl group with 1 or 2 carbon atoms.

The compounds of the formula II which are used are advantageously those wherein $X_1$ represents an unsubstituted alkylene group with 1–4 carbon atoms, an unsubstituted phenylene or cyclohexylene group or a group of the formula

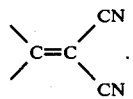

The use of acetonitrile, propionitrile, acrylonitrile, succinodinitrile, adipodinitrile or tetracyanoethylene as compounds of the formula I or II is very particularly preferred.

The compounds of the formula I and II are known or can be manufactured in a known manner. The following may be mentioned specifically as compounds of the formula I or II: cyanogen chloride, cyanogen, bis-cyanomethylamine(iminodiacetonitrile), tris-cyanomethyl-amine(nitrilotriacetonitrile), N,N,N',N'-tetrakis-(cyanomethyl)-ethylenediamine(ethylenediamine-tetraacetonitrile), acetonitrile, monochloroacetonitrile, dichloroacetonitrile and trichloroacetonitrile, aminoacetonitrile, methylaminoacetonitrile, dimethylaminoacetonitrile, propionitrile, 3-chloropropionitrile, 3-bromopropionitrile, 3-aminopropionitrile, 3-methylaminopropionitrile, 3-dimethylaminopropionitrile and 3-diethylaminopropionitrile, butyronitrile, 4-chlorobutyronitrile, 4-diethylaminobutyronitrile, capronitrile, isocapronitrile, oenanthonitrile, N-pyrrolidino-, N-piperidino- and hex-amethyleneimino-acetonitrile, 4-(N-pyrrolidino)-, 4-(N-piperidino)- and 4-(N-hexamethyleneimino)-butyronitrile, acrylonitrile, α-methacrylonitrile, 2-chloroacrylonitrile, 3-vinylacrylonitrile, cyclopropanecarboxylic acid nitrile, cyclopentanecarboxylic acid nitrile, cyclohexanecarboxylic acid nitrile, chlorocyclohexanecarboxylic acid nitrile, bromocyclohexanecarboxylic acid nitrile or methylcyclohexanecarboxylic acid nitrile, 4-(N,N-dimethylamino)-cyclohexanecarboxylic acid nitrile, benzonitrile, 1- or 2-naphthonitrile, 2-, 3- or 4-chlorobenzonitrile, 4-bromobenzonitrile, o-, m- or p-tolunitrile, aminobenzonitrile, 4-dimethylaminobenzonitrile and 4-diethylaminobenzonitrile, malodinitrile, chloromaleodinitrile, fumarodinitrile, succinodinitrile, glutarodinitrile, 3-methylglutarodinitrile, adipodinitrile, pimelodinitrile, decanoic acid dinitrile, dodecanoic acid dinitrile, undecanoic acid dinitrile, 2-methyleneglutarodinitrile(2,4-dicyano-1-butene), 3-hexenedicarboxylic acid dinitrile(1,4-dicyano-2-butene), phthalodinitrile, 4-chlorophthalodinitrile, 4-aminophthalodinitrile, isophthalodinitrile, terephthalodinitrile, hexahydroterephthalodinitrile, tetracyanoethylene, 1,2-bis(cyanomethyl)-benzene and 7,7,8,8-tetracyano-quinodimethane[2,5-cyclohexadiene-$\Delta^{1,\alpha:4,\alpha'}$-dimalononitrile].

Examples of transition metals of sub-groups 4–6 of the periodic table which can be used in the process according to the invention are titanium, zirconium, hafnium, vanadium, niobium, tantalum, chromium, molybdenum, tungsten and uranium. Preferred elements are iron, uranium, tantalum, vanadium and tungsten, but especially boron, silicon and titanium.

The iron, boron and silicon and the transition metals of sub-groups 4–6 of the periodic table can be employed in any desired form, for example in the form of the elements. However, they are conveniently used in the form of derivatives, especially in the case of the transition metals according to the definition. Examples of suitable derivatives are hydrides, carbonyls, carbonylhydrides, organometallic compounds and halides, such as silicon hydride ($SiH_4$), titanium hydride ($TiH_2$), zirconium hydride ($ZrH_2$), boranes, chromium hexacarbonyl, molybdenum hexacarbonyl and tungsten hexacarbonyl, iron pentacarbonyl [$Fe(CO)_5$], $FeH_2(CO)_4$, tetraethyltitanium, tetramethylsilane and tetraethylsilane, methyldichlorosilane, trichlorosilane, methyltrichlorosilane, ethyltrichlorosilane, trimethylchlorosilane, boron trichloride, silicon tetrachloride, titanium dibromide, titanium trichloride, titanium tetrachloride and titanium tetrabromide, zirconium tetrachloride, vanadium trichloride and vanadium tetrachloride, niobium pentachloride, tantalum pentachloride, chromium trichloride, tungsten hexachloride and tungsten hexafluoride, iron-II chloride and iron-III chloride, uranium tetrachloride and uranium hexafluoride.

The halides, especially the chlorides, above all those of boron, silicon and the transition metals, are preferred.

Boron trichloride, silicon tetrachloride and titanium tetrachloride are very particularly preferred.

Depending on the end use and/or the type of compound of the formula I or II, it can be desirable to carry out the reaction in the presence of further additives, such as hydrogen, hydrogen chloride, atomic or molecular nitrogen or other compounds which act as sources of nitrogen and/or carbon under the reaction conditions. These substances or compounds can contribute to the formation of the carbides, nitrides or carbonitrides or shift the equilibrium of the formation reaction more towards the nitrides or the carbides. Examples of such additional compounds which act as sources of nitrogen and/or carbon under the reaction conditions are methane, ethane, n-butane, N-methylamine, N,N-diethylamine, ethylenediamine, benzene and ammonia.

The coating, according to the invention, of inorganic substrates with carbides, nitrides and/or carbonitrides can be carried out, within the scope of the definition, in accordance with any desired methods which are in themselves known.

One of the most important processes is the chemical deposition from the gas phase, also referred to as the CVD process (chemical vapour deposition). The reaction in the gas phase can be carried out with application of heat or radiant energy. In this process, the iron, boron and silicon or the transition metals, and the compounds of the formula I or II, are usually employed in the form of gaseous compounds. The reaction temperatures are in general between about 500° and 1,800° C., preferably between 800° and 1,500° C.

Hydrogen is preferably used as the reducing agent. In certain cases it can also be advantageous to use a carrier gas, such as argon, to transport the starting materials into the reaction zone.

According to another method, the substrates to be coated can also be covered with mixtures of materials, for example powder mixtures, or be mixed, and optionally compacted with other materials which contain all or—preferably—some of the starting materials required to form the carbides, nitrides or carbonitrides.

Thereafter, the whole is heated, preferably to temperatures of between 500° and 2,000° C., the heating being carried out, in accordance with the composition of the mixture of materials, in the presence of the starting materials which are as yet lacking in the mixture, that is to say in the presence of a gaseous compound of the formula I or II or in the presence of suitable derivatives, in the gaseous state, of iron, boron or silicon or of a transition metal.

The coating of the substrates with carbides, nitrides and/or carbonitrides can also be carried out by reaction of the starting materials in a plasma, for example by so-called plasma spraying. The plasma can be produced in any desired manner, for example by means of an electric arc, glow discharge or corona discharge. The plasma gases used are preferably argon or hydrogen.

Coatings according to the definition can furthermore be produced in accordance with the flame spraying process, wherein hydrogen/oxygen or acetylene/oxygen flames are generally used.

A further method is to impregnate the substrate which is to be coated with a solution or suspension of a suitable derivative of iron, boron or silicon or of a transition metal and subsequently to react the impregnated material, at elevated temperatures, with a compound of the formula I or II.

The process according to the invention is preferably carried out in accordance with the CVD technique.

Inorganic substrates which can be coated with the aid of the process according to the invention are above all metallic and metalloid substrates, sintered metal carbides and carbon materials of any desired type, which can also contain incompletely pyrolysed constituents, such as glassy (amorphous) carbon, partially graphitised carbon and graphite. The process according to the invention is also suitable for coating ceramic substrates, glasses, oxides, nitrides and carbides.

Examples of metallic substrates are ferrous metals, such as steel and cast iron, titanium, and high-melting metals, such as tungsten, molybdenum, niobium, vanadium and tantalum. Examples of suitable metalloids are boron and silicon, whilst suitable sintered metal carbides, that is to say sintered materials consisting of carbides of the transition metals of sub-groups 4–6 of the periodic table and cobalt as the binder, are above all alloys of tungsten carbide/cobalt, tungsten carbide/tantalum carbide/cobalt, tungsten carbide/titanium carbide/cobalt, tungsten carbide/vanadium carbide/cobalt, tungsten carbide/titanium carbide/tantalum carbide/cobalt, tungsten carbide/tantalum carbide/niobium carbide/cobalt and tungsten carbide/titanium carbide/tantalum carbide/niobium carbide/cobalt. Examples of suitable ceramic substrates and oxides are porcelain, chamotte and clay materials, or aluminium oxide, $SiO_2$ and zirconium dioxide. Examples of nitrides and carbides are $Si_3N_4$, SiC and chromium carbides.

If carbon materials are used as substrates, a considerable improvement in the oxidation resistance and corrosion resistance of the carbon materials can in some cases be achieved by coating the materials in accordance with the invention.

The substrates can consist wholly or partially of one or more of the materials mentioned and can be in any desired form, for example in the form of powders, fibres, foils, filaments, machined articles or components of very diverse types.

Depending on the choice of the starting materials and additives, the reaction temperatures and/or the substrates, carbides, nitrides, carbonitrides or mixtures thereof are formed in accordance with the process of the invention.

The principal fields in which the process according to the invention is applied are: the surface improvement or surface hardening of metals and sintered metal carbides to increase the wear resistance and corrosion resistance, for example in the case of tool steel, cast iron, titanium, metal substrates containing titanium, sheet tantalum, sheet vanadium and sheet iron and sintered metal carbides of the abovementioned type, such as WC-Co alloys, for example for use in lathe tools, press tools, punches, cutting tools and drawing dies, engine components, precision components for watches and textile machinery, rocket jets, corrosion-resistant apparatuses for the chemical industry, and the like; the coating of carbon electrodes and graphite electrodes, of carbon fibres, including so-called "chopped fibres", to protect the fibres, to improve the adhesion and wettability by the metal matrix and to prevent undesired reactions between the carbon fibres and the metal matrix, of carbon-carbon composites, above all for turbine construction, of graphite seals and the like; the coating of ceramic materials or glasses, for example ceramic supports for catalysts and filter glasses, and, finally, the coating of boron, silicon and tungsten fibres or filaments to achieve better wettability by the metal matrix, and to protect the fibres.

Depending on the choice of the starting materials, additives, and reaction temperatures, carbides, nitrides, carbonitrides or mixtures thereof are formed in accordance with the process of the invention.

EXAMPLE 1

The experiments are carried out in a vertical CVD reactor of Pyrex glass which is closed at the top and bottom by means of a flange lid. The reaction gases are passed into the reactor through a sprayhead, to achieve a uniform stream of gas. The temperature on the substrate is measured by means of a pyrometer. The compounds of the formula I or II are—where necessary—vaporised in a vaporiser device inside or outside the reactor.

The substrate can be heated by resistance heating, high frequency heating or inductive heating or in a reactor externally heated by means of a furnace.

A steel wire of diameter 0.78 mm (steel 17 VDT; 1% by weight of C, 0.1% by weight of Si, 0.25% by weight of Mn, 0.1% by weight of V) is heated to 950° C. by resistance heating in an argon atmosphere in an apparatus of the type described above. At this temperature, a gas mixture consisting of 95% by volume of hydrogen, 2.4% by volume of argon, 1% by volume of titanium tetrachloride and 1.6% by volume of cyanogen chloride is passed over the substrate in the course of 30 minutes, the total gas flow being 0.21 liter/minute [1/min.] and the internal pressure in the reactor being 720 mm Hg. After this period, a dark yellow layer has formed on the substrate. Layer thickness approx. 12 $\mu$m; Vickers micro-hardness $HV_{0.015} = 2,270$ kg/cm$^2$.

EXAMPLE 2

A steel wire of 0.78 mm diameter is provided, by the CVD process, with a 6 $\mu$m thick layer of chromium carbide. This coated steel wire is then treated by the method described in Example 1, for 2 hours at 950° C./720 mm Hg, with a gas mixture consisting of 97% by volume of hydrogen, 1% by volume of titanium tetrachloride and 2% by volume of propionitrile (total gas flow 1.03 l/min.). A dark grey layer, approx. 30 $\mu$m thick, having a micro-hardness $HV_{0.025} = 2,280$ kg/mm$^2$, forms.

EXAMPLES 3–31

The Table I which follows lists further substrates which were coated in the manner described above.

Table I

| Ex. No. | Reactor heating | Temp. °C. | Pressure mm Hg | Reaction time mins. | Gas mixture (in % by vol.) | Total gas flow l/min. | substrate/colour (in % by weight) | layer thickness $\mu$m/appearance of layer | Product micro-hardness $HV_{0.05}$ kg/mm$^2$ (unless stated otherwise) |
|---|---|---|---|---|---|---|---|---|---|
| 3 | resistance heating | 950 | 720 | 120 | 97% H$_2$ 1% TiCl$_4$ 2% o-tolunitrile | 1.03 | "H 10" sintered metal carbide rod (92% WC, 2% TiC + TaC, 6% Co) grey-blue, glossy | 70 $\mu$m good adhesion, slightly porous | substrate 1,890 layer 2,200 |
| 4 | resistance heating | 950 | 720 | 120 | 97% H$_2$ 1% TiCl$_4$ 2% succino-dinitrile | 1.03 | "H 10" sintered metal carbide rod, grey-brown, matt | 30 $\mu$m non-porous | substrate 1,790 layer 2,200 |
| 5 | resistance heating | 950 | 720 | 120 | 97% H$_2$ 1% TiCl$_4$ 2% adipo-dinitrile | 1.03 | "H 10" sintered metal carbide rod, matt grey | 158 $\mu$m non-porous, good adhesion | substrate 2,190 layer 2,760–3,070 |
| 6 | resistance heating | 950 | 720 | 120 | 97% H$_2$ 1% TiCl$_4$ 2% tetra-cyanoethylene | 1.03 | "H 10" sintered metal carbide rod, matt grey | 100–200 $\mu$m non-porous, good adhesion | substrate 1,690–2,220 layer 2,580–2,960 |
| 7 | resistance heating | 950 | 720 | 50 | 97% H$_2$ 1% TiCl$_4$ 2% 3-chloro-propionitrile | 1.03 | "H 10" sintered metal carbide rod, matt grey | 32 $\mu$m non-porous | substrate 1,690–1,790 layer 2,410–2,850 |
| 8 | resistance heating | 950 | 720 | 120 | 97% H$_2$ 1% TiCl$_4$ 2% 3-dimethyl-aminopropionitrile | 1.03 | "H 45" sintered metal carbide rod (87% WC, 1% TiC + TaC, 12% Co) light grey, glossy | 50 $\mu$m non-porous, good adhesion | substrate 1,280–1,950 layer 2,410 |
| 9 | resistance heating | 950 | 720 | 120 | 97% H$_2$ 1% TiCl$_4$ 2% cyclohexane carboxylic acid nitrile | 1.03 | "H 45" sintered metal carbide rod (87% WC, 1% TiC + TaC, 12% Co) light grey, glossy | 60 $\mu$m non-porous, good adhesion | substrate 1,140–1,380 layer 3,070–3,180 |
| 10 | resistance heating | 1,500 | 720 | 120 | 97% H$_2$ 1% TiCl$_4$ 2% 3-chloro-propionitrile | 1.03 | niobium wire $\phi$ 0.5 mm grey, glossy | 80 $\mu$m slightly porous | substrate 195 layer 3,710 |
| 11 | high frequency heating | 1,300 | 720 | 120 | 97% H$_2$ 1% TiCl$_4$ 2% succino-dinitrile | 0.25 | titanium wire, $\phi$ 1 mm light grey, glossy | 80 $\mu$m non-porous | substrate layer |
| 12 | resistance heating | 1,200 | 720 | 120 | 85% H$_2$ 5% BCl$_3$ 10% acrylonitrile | 0.5 | tungsten wire $\phi$ 0.6 mm, dark grey, matt | 150 $\mu$m good adhesion, non-porous layer containing | substrate 549–593 layer 2,190–2,340 |

Table I-continued

| Ex. No. | Reactor heating | Temp. °C. | Pressure mm Hg | Reaction time mins. | Gas mixture (in % by vol.) | Total gas flow l/min. | Product substrate/colour (in % by weight) | layer thickness μm/appearance of layer | micro-hardness $HV_{0.05}$ kg/mm² (unless stated otherwise) |
|---|---|---|---|---|---|---|---|---|---|
| 13 | resistance heating | 1200 | 720 | 120 | 85% $H_2$<br>5% $BBr_3$<br>10% acrylo-nitrile | 0.5 | tungsten wire<br>φ 0.6 mm<br>grey-brown,<br>glossy | 160 μm<br>non-porous<br>layer containing C/N according to chemical analysis | substrate 480–501<br>layer 5,260<br>($HV_{0.02}$ = 4,020) |
| 14 | resistance heating | 1100 | 720 | 120 | 97% $H_2$<br>1% $ZrCl_4$<br>2% aceto-nitrile | 1.03 | tungsten wire<br>φ 0.6 mm, light grey, glossy | approx. 1 μm<br>non-porous | — |
| 15 | externally heated by a furnace | 800 | 100 | 315 | 97.5% $H_2$<br>1.5% $TiCl_4$<br>1% aceto-nitrile | 0.4 | Bohler KRS special steel (12% Cr, 0.5% Mo, 1.1% W, 0.5% V, 2.05% C) matt grey, glossy | 16 μm<br>slightly porous,<br>good adhesion | substrate 666<br>layer 3,070 |
| 16 | externally heated by a furnace | " | " | " | 97.5% $H_2$<br>1.5% $TiCl_4$<br>1% aceto-nitrile | " | tungsten, matt grey, glossy | 18 μm<br>non-porous,<br>good adhesion | substrate 473<br>layer approx. 3,000 |
| 17 | externally heated by a furnace | " | " | " | 97.5% $H_2$<br>1.5% $TiCl_4$<br>1% aceto-nitrile | " | molybdenum, matt grey, glossy | 22 μm<br>non-porous,<br>good adhesion | substrate 336<br>layer approx. 3,000 |
| 18 | externally heated by a furnace | " | " | " | 97.5% $H_2$<br>1.5% $TiCl_4$<br>1% aceto-nitrile | " | niobium matt grey, glossy | 20 μm<br>slightly porous,<br>good adhesion | substrate 137<br>layer approx. 2,600 |
| 19 | externally heated by a furnace | " | " | " | 97.5% $H_2$<br>1.5% $TiCl_4$<br>1% aceto-nitrile | " | $Al_2O_3$ matt grey, glossy | 22 μm<br>non-porous,<br>good adhesion | substrate 1,950<br>layer approx. 2,600 |
| 20 | externally heated by a furnace | 800 | 100 | 315 | 97.5% $H_2$<br>1.5% $TiCl_4$<br>1% aceto-nitrile | 0.4 | porcelain matt grey, glossy | 16 μm<br>non-porous,<br>good adhesion | substrate 1,100<br>layer 3,070 |
| 21 | externally heated by a furnace | " | " | " | 97.5% $H_2$<br>1.5% $TiCl_4$<br>1% aceto-nitrile | " | $SiO_2$ matt grey, glossy | 22 μm<br>slightly porous,<br>good adhesion | layer approx. 2,500 |
| 22 | externally heated by a furnace | " | " | " | 97.5% $H_2$<br>1.5% $TiCl_4$<br>1% aceto-nitrile | " | 17 VDT steel matt grey, glossy | 18 μm<br>non-porous,<br>good adhesion | substrate 274<br>layer approx. 3,200 |
| 23 | externally heated by a furnace | 580 | 100 | 480 | 97.5% $H_2$<br>1.5% $TiCl_4$<br>1% aceto-nitrile | " | Pyrex glass grey, glossy | approx. 1 μm<br>non-porous,<br>good adhesion | — |
| 24 | externally heated by a furnace | 450 | 150 | 240 | 97.5% $H_2$<br>1.5% $TiCl_4$<br>1% aceto-nitrile | 0.5 | Pyrex glass, grey-violet, glossy | a few Å | — |
| 25 | externally heated by a furnace | 760 | 250 | 240 | 97% $H_2$<br>1.5% $TiCl_4$<br>1.5% acrylo-nitrile | 0.5 | $Si_3N_4$, matt grey | 20 μm<br>good adhesion,<br>slightly porous | substrate approx. 1,000 layer $HV_{0.015}$ approx. 3,090 |
| 26 | externally heated by a furnace | 760 | 250 | 240 | 97% $H_2$<br>1.5% $TiCl_4$<br>1.5% acrylo-nitrile | 0.5 | "S 4" sintered metal carbide (68.5% WC, 22% TiC + TaC, 9.5% Co) grey, glossy | 22 μm<br>good adhesion,<br>slightly porous | substrate 1,310–1,896<br>layer 2,440 |
| 27 | externally heated by a furnace | 760 | 150 | 180 | 97.5% $H_2$<br>1.5% $TiCl_4$<br>1% butyro-nitrile | 0.5 | "S 4" sintered metal carbide matt grey | 22 μm<br>good adhesion,<br>slightly porous | substrate 1,890<br>layer 2,410–2,580 |
| 28 | externally heated by a furnace | 840 | 100 | 240 | 98% $H_2$<br>1.25% $TiCl_4$<br>0.75% aceto-nitrile | 0.5 | "S 4" sintered metal carbide matt grey | 15 μm<br>good adhesion,<br>non-porous | substrate 2,070<br>layer 2,910 |
| 29 | externally heated by a furnace | 840 | 100 | 240 | 98% $H_2$<br>1.25% $TiCl_4$<br>0.75% aceto- | 0.5 | boron matt grey | 22 μm<br>slightly porous,<br>good adhesion | substrate 3,710<br>layer 2,190 |

Table I-continued

| Ex. No. | Reactor heating | Temp. °C. | Pressure mm Hg | Reaction time mins. | Gas mixture (in % by vol.) | Total gas flow l/min. | Product substrate/colour (in % by weight) | layer thickness μm/appearance of layer | micro-hardness $HV_{0.05}$ kg/mm² (unless stated otherwise) |
|---|---|---|---|---|---|---|---|---|---|
| 30 | externally heated by a furnace | 800 | 20 | 240 | 97.5% $H_2$ 1.5% $TiCl_4$ 1% aceto-nitrile | 0.4 | chamotte grey | 8 μm good adhesion, slightly porous | $HV_{0.015}$ = approx. 2,500 |
| 31 | externally heated by a furnace | 800 | 20 | 240 | 97.5% $H_2$ 1.5% $TiCl_4$ 1% aceto-nitrile | 0.4 | Pyrex glass grey | 12 μm good adhesion, slightly porous | $HV_{0.015}$ = approx. 2,700 |

EXAMPLE 32

A graphite rod of 2 mm diameter is heated by resistance heating to 950° C. in an argon atmosphere in an apparatus of the type described in Example 1. At this temperature, a gas mixture consisting of 97% by volume of hydrogen, 2% by volume of acetonitrile and 1% by volume of titanium tetrachloride is passed over the substrate for 2 hours, the total gas flow being 1.03 liter/minute [l/min.] and the internal pressure in the reactor being 720 mm Hg. After this time, a grey-violet, hard layer has formed on the graphite rod. The layer, which adheres very firmly, is 70 μm thick and has a Vickers micro-hardness of $HV_{0.01} > 4,000$ kg/mm².

EXAMPLE 33

A graphite rod of 2 mm diameter is heated to 950° C. in an argon atmosphere in an apparatus of the type described above. At this temperature, a gas mixture consisting of 94.4% by volume of hydrogen, 2.3% by volume of argon, 1.4% by volume of titanium tetrachloride and 1.9% by volume of cyanogen chloride is passed over the substrate for 1 hour, the total gas flow being 0.21 l/min. and the internal pressure in the reactor being 720 mm Hg. After this time, a grey, hard layer has formed on the graphite rod. The layer, which adheres very firmly, is 30 μm thick and has a Vickers micro-hardness of $HV_{0.05} = 3,700$ kg/mm².

EXAMPLES 34-46

Table II which follows lists further carbon materials which were coated in the manner described above:

Table II

| Ex. | Reactor heating | Temp. °C. | Pressure mm Hg | Reaction time mins. | Gas mixture (in % by vol.) | Total gas flow l/min. | Product substrate/colour (in % by weight) | layer thickness μm/appearance of layer | micro-hardness $HV_{0.05}$ kg/mm² |
|---|---|---|---|---|---|---|---|---|---|
| 34 | resistance heating | 950 | 720 | 120 | 97% $H_2$ 1% $TiCl_4$ 2% cyanogen chloride | 1.03 | graphite rod φ 2 mm, grey | 45 μm | 2,960–3,430 |
| 35 | resistance heating | 1200 | 720 | 120 | 97% $H_2$ 1% $SiCl_4$ 2% butyro-nitrile | " | graphite rod φ 2 mm grey, glossy | 100 μm | 4,000–5,000 |
| 36 | resistance heating | " | " | " | 97% $H_2$ 1% $HSiCl_3$ 2% aceto-nitrile | " | graphite rod φ 2 mm, grey | 500 μm | approx. 5,000 |
| 37 | resistance heating | " | " | " | 97% $H_2$ 1% $HSiCl_3$ 2% butyro-nitrile | " | graphite rod φ 2 mm grey, glossy | 400 μm | 3,000–5,000 |
| 38 | resistance heating | " | " | " | 97% $H_2$ 1% $CH_3SiHCl_2$ 2% acrylo-nitrile | " | graphite rod φ 2 mm grey, glossy | 430 μm | 3,700–6,000 |
| 39 | resistance heating | " | " | " | 97% $H_2$ 0.5% $Ch_3SiHCl_2$ 2.5% aceto-nitrile | " | graphite rod φ 2 mm grey, glossy | 200 μm | approx. 3,000 |
| 40 | resistance heating | 1,200 | 720 | 120 | 97% $H_2$ 1% $Si(CH_3)_4$ 2% butyro-nitrile | 1.03 | graphite rod φ 2 mm dark grey, matt | 250 μm | 3,400–4,000 |
| 41 | resistance heating | 1400 | 720 | 120 | 97% $H_2$ 1% $SiCl_4$ 2% butyro-nitrile | 1.03 | graphite rod φ 2 mm, dark grey, matt | 350 μm | $HV_{0.02}$ = 4,000 $HV_{0.05}$ = 4,000–5,900 |
| 42 | externally heated by a furnace | 800 | 100 | 315 | 97.5% $H_2$ 1.5% $TiCl_4$ 1% aceto-nitrile | 0.4 | C/C composite, matt grey | 22 μm good adhesion, non-porous | approx. 3,000 |

Table II-continued

| Ex. | Reactor heating | Temp. °C. | Pressure mm Hg | Reaction time mins. | Gas mixture (in % by vol.) | Total gas flow l/min. | Product substrate/colour (in % by weight) | layer thickness μm/appearance of layer | micro-hardness $HV_{0.05}$ kg/mm² |
|---|---|---|---|---|---|---|---|---|---|
| 43 | externally heated by a furnace | 760 | 720 | 190 | 98% H₂ 1% TiCl₄ 1% acrylonitrile | 1.03 | graphite, matt grey | 10 μm slightly porous | approx. 1,450 |
| 44 | externally heated by a furnace | 840 | 100 | 240 | 98% H₂ 1.25% TiCl₄ 0.75% acetonitrile | 0.5 | graphite, matt grey | 22 μm good adhesion, non-porous | $HV_{0.015} = 3,090$ |
| 45 | externally heated by a furnace | 840 | 100 | 240 | 98% H₂ 1.25% TiCl₄ 0.75% acetonitrile | 0.5 | glassy carbon, matt grey | 18 μm good adhesion, non-porous | $HV_{0.015} = 2,720$–$3,090$ |
| 46 | externally heated by a furnace | 800 | 20 | 240 | 97.5% H₂ 1.5% TiCl₄ 1% acetonitrile | 0.4 | carbon fibre, grey | 14 μm good adhesion, slightly porous | $HV_{0.015} = $ approx. 3,000 |

EXAMPLE 47

The experiment is carried out in a plasma reactor using a plasma torch of conventional construction [Model PJ 139 H of Messrs. Arcos, Brussels; torch rating: 7.8 kw (30 V, 260 A)]. The reactor is located in a water-cooled reaction chamber of stainless steel, sealed from the outside atmosphere. The plasma is produced by a DC light arc formed between the tungsten cathode and the copper anode of the plasma torch. The cathode and anode are also water-cooled. Argon or hydrogen can be used as plasma gases. The reaction gases are introduced into the plasma beam with the aid of a carrier gas, through lateral bores in the outlet jet of the copper anode. The concentration of the reaction gases in the stream of carrier gas is adjusted by means of thermostatically controllable vaporiser devices and flow regulators. The substrate, which under certain circumstances can be water-cooled, is at a distance of 1–5 cm in front of the outlet orifice of the plasma beam in the copper anode.

At the beginning of the experiment, the reaction chamber is evacuated, flushed and filled with argon. The plasma gas (argon, 90 mols/hour) is then introduced and the plasma flame is lit. A graphite substrate is located at a distance of 2 cm from the outlet orifice of the plasma beam and the reaction gases and the carrier gas are introduced into the plasma beam as follows: titanium tetrachloride: 0.02 mol/hour; carrier gas (hydrogen) for TiCl₄: 1 mol/hour; acetonitrile: 0.05 mol/hour; carrier gas (argon) for acetonitrile: 0.25 mol/hour. The temperature of the plasma flame is above 3,000° C.; the temperature of the substrate surface is approx. 2,500° C. After a reaction time of 15 minutes the plasma torch is switched off and the coated substrate is cooled in the gas-filled reaction chamber. A homogeneous, grey, well-adhering layer having a metallic gloss is obtained; thickness 4 μm; composition as determined by X-ray diffraction: TiC (lattice constant a=4.33 Å).

EXAMPLE 48

An aluminium oxide substrate is treated analogously to the method described in Example 47. The temperature of the substrate surface during coating is approx. 1,900° C. A hard, relatively porous layer is obtained, which is built up of several zones of different colour. The outermost, grey layer has a lattice constant a=4.31 Å.

We claim:

1. A process for producing on an inorganic substrate a coating of material selected from the group consisting of an element carbide, nitride and carbonitride, said element selected from the group consisting of iron, boron, silicon and the transition metals of sub-groups 4 to 6 of the periodic table, which comprises heating said substrate to a temperature of at least 500° C., and contacting said substrate with a gaseous or vaporous reactant stream comprising a mixture of hydrogen; a derivative of said element selected from the group consisting of its hydride, carbonyl, carbonylhydride, halide and organometallic compounds; and at least one carbon- and nitrogen-releasing compound of formula I or II $$X-C\equiv N \quad \text{or} \quad N\equiv C-X_1-C\equiv N$$
$$(I) \qquad\qquad\qquad (II)$$

wherein X represents

—CH₂NHCH₂CN,

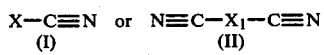

—CH₂N(CH₂CN)₂, —CH₂—NCH₂CH₂N(CH₂CN)₂, an alkyl group with 1–6 carbon atoms; said alkyl group substituted by halogen atoms,

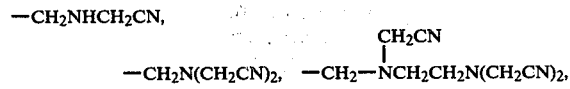

an alkenyl group with 2–4 carbon atoms; said alkenyl group substituted by halogen atoms or

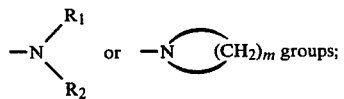

a cycloalkyl group with 3–6 atoms or an aryl group with 6–10 carbon atoms; said cycloalkyl group or said aryl group substituted by halogen atoms, methyl groups or

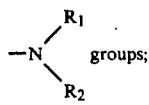 groups;

$X_1$ represents an alkylene group with 1–10 carbon atoms; an alkenylene group with 2–4 carbon atoms; a phenylene or cyclohexylene group; said phenylene or cyclohexylene group substituted by halogen atoms or

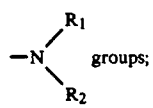 groups;

or a group of the formula

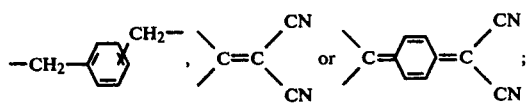

and $R_1$ and $R_2$ independently of one another denote hydrogen or an alkyl group with 1–4 carbon atoms, and m denotes an integer from 4 to 7; permitting reaction thereof to form said coating on said substrate.

2. A process according to claim 1 using at least one compound of the formula II, wherein $X_1$ represents an unsubstituted alkylene group with 1–4 carbon atoms, an unsubstituted phenylene or cyclohexylene group or a group of the formula

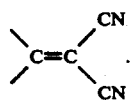

3. A process as claimed in claim 1, characterized by the use of acetonitrile as the compound of formula I.

4. A process as claimed in claim 1, characterized by the use of acrylonitrile as the compound of formula I.

5. A process as claimed in claim 1, characterized by the use of adipic acid dinitrile as the compound of formula II.

6. A process as claimed in claim 1, characterized by the use of succinic acid dinitrile as the compound of formula II.

7. A process as claimed in claim 1, characterized by the use of tetracyanoethylene as the compound of formula II.

8. A process according to claim 1 using at least one compound of formula I wherein X represents an alkyl group with 1–4 carbon atoms; said alkyl group substituted by chlorine atoms or

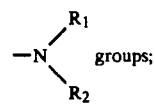 groups;

an alkenyl group with 2–4 carbon atoms; said alkenyl group substituted with chlorine atoms; phenyl; or said phenyl substituted by halogen atoms; methyl groups or

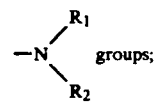 groups;

where $R_1$ and $R_2$ independently of one another denote hydrogen or an alkyl with 1–2 carbon atoms.

9. A process according to claim 1 wherein the inorganic substrate is a metallic or metalloid material.

10. A process according to claim 1 wherein the inorganic substrate is a sintered metal carbide.

11. A process according to claim 1 wherein the inorganic substrate is a carbon material.

12. A process according to claim 1 which further comprises
adding argon as a carrier gas to transport the starting materials into the reaction zone.

13. A process according to claim 1 wherein said substrate is heated to a temperature of 800° C. to 1500° C.

14. A process according to claim 1 wherein the reaction pressure is from 20 to 800 mm Hg.

15. A process according to claim 1 wherein said carbon and nitrogen-releasing compound is present in the gaseous reactant stream at a concentration of up to 10% by volume.

* * * * *